United States Patent
Khlat

(10) Patent No.: US 11,906,992 B2
(45) Date of Patent: Feb. 20, 2024

(54) DISTRIBUTED POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/942,472

(22) Filed: Sep. 12, 2022

(65) Prior Publication Data

US 2023/0081095 A1  Mar. 16, 2023

Related U.S. Application Data

(60) Provisional application No. 63/245,142, filed on Sep. 16, 2021.

(51) Int. Cl.
*G05F 1/46* (2006.01)
*H04L 27/26* (2006.01)

(52) U.S. Cl.
CPC ............ *G05F 1/46* (2013.01); *H04L 27/2605* (2013.01)

(58) Field of Classification Search
None
See application file for complete search history.

(56) References Cited

U.S. PATENT DOCUMENTS

| | | |
|---|---|---|
| 4,797,898 A | 1/1989 | Martinez |
| 6,529,716 B1 | 3/2003 | Eidson et al. |
| 6,788,151 B2 | 9/2004 | Shvarts et al. |
| 7,859,338 B2 * | 12/2010 | Bajdechi ............... H03F 1/0205 330/253 |
| 8,019,289 B2 | 9/2011 | Gorbachov |
| 8,159,309 B1 | 4/2012 | Khlat et al. |
| 8,290,453 B2 | 10/2012 | Yoshihara |
| 8,385,859 B2 | 2/2013 | Hamano |

(Continued)

FOREIGN PATENT DOCUMENTS

| | | |
|---|---|---|
| CN | 105812073 A | 7/2016 |
| DE | 102019218816 A1 | 6/2020 |

(Continued)

OTHER PUBLICATIONS

Non-Final Office Action for U.S. Appl. No. 17/217,654, dated Jul. 1, 2022, 9 pages.

(Continued)

*Primary Examiner* — Thomas J. Hiltunen
(74) *Attorney, Agent, or Firm* — Withrow & Terranova, P.L.L.C.

(57) ABSTRACT

A distributed power management circuit is provided. In embodiments disclosed herein, the distributed power management circuit can achieve multiple performance enhancing objectives simultaneously. More specifically, the distributed power management circuit can be configured to switch a modulated voltage from one voltage level to another within a very short switching window, reduce in-rush current required for switching the modulated voltage, and minimize a ripple in the modulated voltage, all at same time. As a result, the distributed power management circuit can be provided in a wireless device (e.g., smartphone) to enable very fast voltage switching across a wide modulation bandwidth (e.g., 400 MHz) with reduced power consumption and voltage distortion.

20 Claims, 9 Drawing Sheets

(56) References Cited

U.S. PATENT DOCUMENTS

| | | | |
|---|---|---|---|
| 8,476,976 B2 | 7/2013 | Wimpenny | |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,718,188 B2 | 5/2014 | Balteanu et al. | |
| 8,803,603 B2 | 8/2014 | Wimpenny | |
| 8,816,272 B1 | 8/2014 | Brown et al. | |
| 8,816,768 B2 | 8/2014 | Tseng et al. | |
| 8,818,305 B1 | 8/2014 | Schwent et al. | |
| 8,912,769 B2 | 12/2014 | Lin et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,020,453 B2 | 4/2015 | Briffa et al. | |
| 9,036,734 B1 | 5/2015 | Mauer et al. | |
| 9,065,504 B2 | 6/2015 | Kwon et al. | |
| 9,065,509 B1 | 6/2015 | Yan et al. | |
| 9,069,365 B2 | 6/2015 | Brown et al. | |
| 9,112,413 B2 | 8/2015 | Barth et al. | |
| 9,148,090 B2 | 9/2015 | Tsuji | |
| 9,172,331 B2 | 10/2015 | Nagasaku et al. | |
| 9,197,162 B2 | 11/2015 | Chiron et al. | |
| 9,197,256 B2 | 11/2015 | Khlat | |
| 9,231,527 B2 | 1/2016 | Hur et al. | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,350,299 B2 | 5/2016 | Tsuji | |
| 9,356,760 B2* | 5/2016 | Larsson | H04L 1/1812 |
| 9,374,005 B2 | 6/2016 | Rozek et al. | |
| 9,379,667 B2 | 6/2016 | Khlat et al. | |
| 9,391,567 B2 | 7/2016 | Kacman | |
| 9,407,476 B2 | 8/2016 | Lim et al. | |
| 9,438,172 B2 | 9/2016 | Cohen | |
| 9,438,196 B2 | 9/2016 | Smith et al. | |
| 9,496,828 B2 | 11/2016 | Ye | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,560,595 B2* | 1/2017 | Dakshinamurthy | H04W 52/0251 |
| 9,571,152 B2 | 2/2017 | Ripley et al. | |
| 9,590,563 B2 | 3/2017 | Wimpenny | |
| 9,596,110 B2 | 3/2017 | Jiang et al. | |
| 9,614,476 B2 | 4/2017 | Khlat | |
| 9,614,477 B1 | 4/2017 | Rozenblit et al. | |
| 9,634,560 B2 | 4/2017 | Ek | |
| 9,641,206 B2 | 5/2017 | Pratt et al. | |
| 9,671,801 B2 | 6/2017 | Bhattad et al. | |
| 9,692,366 B2 | 6/2017 | Pilgram | |
| 9,743,357 B2 | 8/2017 | Tabe | |
| 9,831,834 B2 | 11/2017 | Balteanu et al. | |
| 9,831,934 B2 | 11/2017 | Kotecha et al. | |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2 | 6/2018 | Khesbak et al. | |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,145 B1 | 10/2018 | Khlat et al. | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,142,074 B2 | 11/2018 | Wang et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,243,524 B2 | 3/2019 | Orr | |
| 10,305,429 B2 | 5/2019 | Choo et al. | |
| 10,326,408 B2* | 6/2019 | Khlat | H03F 1/0222 |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,557 B2 | 10/2019 | Khlat et al. | |
| 10,439,789 B2 | 10/2019 | Brunel et al. | |
| 10,454,428 B2 | 10/2019 | Khesbak et al. | |
| 10,476,437 B2 | 11/2019 | Nag et al. | |
| 10,778,094 B2 | 9/2020 | de Cremoux | |
| 10,862,428 B2 | 12/2020 | Henzler et al. | |
| 10,998,859 B2 | 5/2021 | Khlat | |
| 11,018,627 B2 | 5/2021 | Khlat | |
| 11,018,638 B2 | 5/2021 | Khlat et al. | |
| 11,088,660 B2* | 8/2021 | Lin | H03F 1/0227 |
| 11,223,325 B2 | 1/2022 | Drogi et al. | |
| 11,349,513 B2 | 5/2022 | Stockert et al. | |
| 11,387,789 B2* | 7/2022 | Khlat | H02M 3/1584 |
| 11,424,719 B2* | 8/2022 | Khlat | H03F 1/0233 |
| 11,569,783 B2* | 1/2023 | Nomiyama | H03F 3/21 |
| 2003/0099230 A1 | 5/2003 | Wenk | |
| 2004/0100323 A1 | 5/2004 | Khanifer et al. | |
| 2004/0179382 A1 | 9/2004 | Thaker et al. | |
| 2005/0100105 A1 | 5/2005 | Jensen | |
| 2006/0068710 A1 | 3/2006 | Jensen | |
| 2006/0209981 A1 | 9/2006 | Kluesing et al. | |
| 2009/0128236 A1 | 5/2009 | Wilson | |
| 2009/0253389 A1 | 10/2009 | Ma et al. | |
| 2010/0298030 A1 | 11/2010 | Howard | |
| 2011/0109393 A1 | 5/2011 | Adamski et al. | |
| 2011/0182347 A1 | 7/2011 | Cheung | |
| 2011/0223875 A1 | 9/2011 | Hamano | |
| 2012/0068767 A1 | 3/2012 | Henshaw et al. | |
| 2012/0142304 A1 | 6/2012 | Degani et al. | |
| 2012/0146731 A1 | 6/2012 | Khesbak | |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141063 A1 | 6/2013 | Kay et al. | |
| 2013/0141068 A1 | 6/2013 | Kay et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0055197 A1 | 2/2014 | Khlat et al. | |
| 2014/0057684 A1 | 2/2014 | Khlat | |
| 2014/0065989 A1 | 3/2014 | McLaurin | |
| 2014/0084996 A1 | 3/2014 | Schwent et al. | |
| 2014/0097895 A1 | 4/2014 | Khlat et al. | |
| 2014/0105264 A1 | 4/2014 | McLaurin et al. | |
| 2014/0111279 A1 | 4/2014 | Brobston | |
| 2014/0184337 A1 | 7/2014 | Nobbe et al. | |
| 2014/0213196 A1 | 7/2014 | Langer et al. | |
| 2014/0218109 A1 | 8/2014 | Wimpenny | |
| 2014/0232458 A1 | 8/2014 | Arno et al. | |
| 2014/0273897 A1 | 9/2014 | Drogi et al. | |
| 2014/0306763 A1 | 10/2014 | Hong et al. | |
| 2014/0306769 A1 | 10/2014 | Khlat et al. | |
| 2014/0312710 A1 | 10/2014 | Li | |
| 2014/0315504 A1* | 10/2014 | Sakai | H03F 3/189 455/127.2 |
| 2014/0354251 A1 | 12/2014 | Williams | |
| 2014/0361837 A1 | 12/2014 | Strange et al. | |
| 2015/0009980 A1 | 1/2015 | Modi et al. | |
| 2015/0091645 A1 | 4/2015 | Park et al. | |

(56) References Cited

U.S. PATENT DOCUMENTS

| | | |
|---|---|---|
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094185 A1 | 3/2016 | Shute |
| 2016/0094186 A1 | 3/2016 | Cohen |
| 2016/0094192 A1 | 3/2016 | Khesbak et al. |
| 2016/0099686 A1 | 4/2016 | Perreault et al. |
| 2016/0105151 A1 | 4/2016 | Langer |
| 2016/0173030 A1 | 6/2016 | Langer et al. |
| 2016/0181995 A1 | 6/2016 | Nentwig et al. |
| 2016/0182100 A1 | 6/2016 | Menkhoff et al. |
| 2016/0204809 A1 | 7/2016 | Pratt et al. |
| 2016/0226448 A1 | 8/2016 | Wimpenny |
| 2016/0241208 A1 | 8/2016 | Lehtola |
| 2016/0294587 A1 | 10/2016 | Jiang et al. |
| 2017/0005676 A1 | 1/2017 | Yan et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0331433 A1 | 11/2017 | Khlat |
| 2017/0338842 A1 | 11/2017 | Pratt |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0234011 A1 | 8/2018 | Muramatsu et al. |
| 2018/0248570 A1 | 8/2018 | Camuffo |
| 2018/0257496 A1 | 9/2018 | Andoh et al. |
| 2018/0278213 A1 | 9/2018 | Henzler et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0351454 A1 | 12/2018 | Khesbak et al. |
| 2018/0358930 A1 | 12/2018 | Haine |
| 2019/0036493 A1 | 1/2019 | Khlat et al. |
| 2019/0044480 A1 | 2/2019 | Khlat |
| 2019/0068234 A1 | 2/2019 | Khlat et al. |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0181813 A1 | 6/2019 | Maxim et al. |
| 2019/0222175 A1 | 7/2019 | Khlat et al. |
| 2019/0222176 A1 | 7/2019 | Khlat |
| 2019/0222178 A1 | 7/2019 | Khlat et al. |
| 2019/0222181 A1 | 7/2019 | Khlat |
| 2019/0267947 A1 | 8/2019 | Khlat et al. |
| 2019/0288645 A1 | 9/2019 | Nag et al. |
| 2019/0296929 A1 | 9/2019 | Milicevic et al. |
| 2019/0319583 A1 | 10/2019 | El-Hassan et al. |
| 2019/0334750 A1 | 10/2019 | Nomiyama et al. |
| 2019/0356285 A1* | 11/2019 | Khlat ........................ H03F 1/02 |
| 2020/0036337 A1 | 1/2020 | Khlat |
| 2020/0076297 A1 | 3/2020 | Nag et al. |
| 2020/0076375 A1 | 3/2020 | Khlat |
| 2020/0076376 A1 | 3/2020 | Khlat |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136563 A1 | 4/2020 | Khlat |
| 2020/0136575 A1 | 4/2020 | Khlat et al. |
| 2020/0204422 A1 | 6/2020 | Khlat |
| 2020/0212796 A1 | 7/2020 | Murphy et al. |
| 2020/0228063 A1 | 7/2020 | Khlat |
| 2020/0266766 A1 | 8/2020 | Khlat et al. |
| 2020/0295708 A1 | 9/2020 | Khlat |
| 2020/0295710 A1 | 9/2020 | Khlat |
| 2020/0295713 A1 | 9/2020 | Khlat |
| 2020/0321917 A1 | 10/2020 | Nomiyama et al. |
| 2020/0336105 A1 | 10/2020 | Khlat |
| 2020/0336111 A1 | 10/2020 | Khlat |
| 2020/0343859 A1 | 10/2020 | Khlat |
| 2020/0350878 A1 | 11/2020 | Drogi et al. |
| 2020/0382061 A1 | 12/2020 | Khlat |
| 2020/0382062 A1 | 12/2020 | Khlat |
| 2020/0382074 A1 | 12/2020 | Khlat |
| 2020/0389132 A1 | 12/2020 | Khlat et al. |
| 2021/0006206 A1 | 1/2021 | Khlat |
| 2021/0036604 A1 | 2/2021 | Khlat et al. |
| 2021/0126599 A1 | 4/2021 | Khlat et al. |
| 2021/0175798 A1 | 6/2021 | Liang |
| 2021/0184708 A1 | 6/2021 | Khlat |
| 2021/0194517 A1* | 6/2021 | Mirea ........................ H03F 3/24 |
| 2021/0226585 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0384869 A1 | 12/2021 | Khlat |
| 2021/0389789 A1 | 12/2021 | Khlat et al. |
| 2021/0391833 A1 | 12/2021 | Khlat et al. |
| 2021/0399690 A1 | 12/2021 | Panseri et al. |
| 2022/0021302 A1 | 1/2022 | Khlat et al. |
| 2022/0029614 A1 | 1/2022 | Khlat |
| 2022/0037982 A1 | 2/2022 | Khlat et al. |
| 2022/0052655 A1 | 2/2022 | Khalt |
| 2022/0057820 A1 | 2/2022 | Khlat et al. |
| 2022/0066487 A1 | 3/2022 | Khlat |
| 2022/0069788 A1 | 3/2022 | King et al. |
| 2022/0123744 A1 | 4/2022 | Khlat |
| 2022/0200447 A1 | 6/2022 | Khlat |
| 2022/0216834 A1 | 7/2022 | Myoung et al. |
| 2022/0224364 A1 | 7/2022 | Kim et al. |
| 2022/0255513 A1 | 8/2022 | Khlat |
| 2022/0271714 A1 | 8/2022 | Khlat |
| 2022/0407462 A1 | 12/2022 | Khlat |
| 2022/0407463 A1 | 12/2022 | Khlat et al. |
| 2022/0407464 A1 | 12/2022 | Khlat et al. |
| 2022/0407465 A1 | 12/2022 | Khlat |
| 2022/0407478 A1 | 12/2022 | Khlat et al. |
| 2023/0079153 A1 | 3/2023 | Khlat |
| 2023/0080621 A1 | 3/2023 | Khlat |
| 2023/0080652 A1 | 3/2023 | Khlat et al. |
| 2023/0082145 A1 | 3/2023 | Lin et al. |

FOREIGN PATENT DOCUMENTS

| | | | |
|---|---|---|---|
| EP | 2582041 | B1 | 4/2018 |
| EP | 2232713 | B1 | 10/2018 |
| EP | 3416340 | A1 | 12/2018 |
| EP | 3644500 | A1 | 4/2020 |
| WO | 2018182778 | A1 | 10/2018 |
| WO | 2018187245 | A1 | 10/2018 |
| WO | 2021016350 | A1 | 1/2021 |

OTHER PUBLICATIONS

Non-Final Office Action for U.S. Appl. No. 17/218,904, dated May 25, 2022, 14 pages.

Notice of Allowance for U.S. Appl. No. 17/315,652, dated Jun. 20, 2022, 8 pages.

Mellon, L., "Data Transmission—Parallel vs Serial," Jul. 10, 2017, https://www.quantil.com/content-delivery-insights/content-acceleration/data-transmission/, 4 pages.

International Search Report and Written Opinion for International Patent Application No. PCT/US2021/044596, dated Apr. 21, 2022, 13 pages.

Written Opinion for International Patent Application No. PCT/US2021/044596, dated Jun. 10, 2022, 6 pages.

(56) References Cited

OTHER PUBLICATIONS

International Preliminary Report on Patentability for International Patent Application No. PCT/US2021/044596, dated Sep. 1, 2022, 19 pages.
Notice of Allowance for U.S. Appl. No. 17/182,539, dated Sep. 14, 2022, 7 pages.
Notice of Allowance for U.S. Appl. No. 17/217,654, dated Oct. 12, 2022, 8 pages.
Non-Final Office Action for U.S. Appl. No. 17/237,244, dated Sep. 20, 2021, 14 pages.
Notice of Allowance for U.S. Appl. No. 17/237,244, dated Jan. 27, 2022, 8 pages.
Notice of Allowance for U.S. Appl. No. 17/218,904, dated Aug. 26, 2022, 9 pages.
Non-Final Office Action for U.S. Appl. No. 17/325,482, dated Sep. 30, 2021, 10 pages.
Non-Final Office Action for U.S. Appl. No. 17/325,482, dated Mar. 15, 2022, 10 pages.
Final Office Action for U.S. Appl. No. 17/325,482, dated Aug. 16, 2022, 12 pages.
Advisory Action for U.S. Appl. No. 17/325,482, dated Oct. 14, 2022, 3 pages.
Non-Final Office Action for U.S. Appl. No. 17/315,652, dated Sep. 2, 2021, 7 pages.
Non-Final Office Action for U.S. Appl. No. 17/315,652, dated Feb. 14, 2022, 12 pages.
Non-Final Office Action for U.S. Appl. No. 17/408,899, dated Aug. 29, 2022, 13 pages.
International Search Report and Written Opinion for International Patent Application No. PCT/US2021/061721, dated Mar. 14, 2022, 13 pages.
Written Opinion for International Patent Application No. PCT/US2021/061721, dated Sep. 9, 2022, 7 pages.
International Preliminary Report on Patentability for International Patent Application No. PCT/US2021/052151, dated Oct. 13, 2022, 21 pages.
Non-Final Office Action for U.S. Appl. No. 16/263,368, dated Dec. 26, 2019, 6 pages.
Notice of Allowance for U.S. Appl. No. 16/273,288, dated Dec. 13, 2019, 8 pages.
Non-Final Office Action for U.S. Appl. No. 16/263,316, dated Dec. 23, 2019, 9 pages.
Notice of Allowance for U.S. Appl. No. 16/193,513, dated Mar. 25, 2020, 8 pages.
Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Final Office Action for U.S. Appl. No. 16/263,316, dated May 13, 2020, 10 pages.
Non-Final Office Action for U.S. Appl. No. 16/278,886, dated Apr. 29, 2020, 9 pages.
Quayle Action for U.S. Appl. No. 16/267,779, mailed May 1, 2020, 8 pages.
Final Office Action for U.S. Appl. No. 16/263,368, dated May 22, 2020, 9 pages.
Notice of Allowance for U.S. Appl. No. 16/250,229, dated Sep. 22, 2020, 7 pages.
Quayle Action for U.S. Appl. No. 16/267,740, mailed Oct. 19, 2020, 7 pages.
Notice of Allowance for U.S. Appl. No. 16/267,740, dated Mar. 3, 2021, 8 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Notice of Allowance for U.S. Appl. No. 16/270,119, dated Jun. 18, 2020, 9 pages.
Non-Final Office Action for U.S. Appl. No. 17/027,963, dated Aug. 13, 2021, 6 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Quayle Action for U.S. Appl. No. 16/250,298, mailed Feb. 3, 2021, 5 pages.
Notice of Allowance for U.S. Appl. No. 16/250,298, dated Apr. 15, 2021, 8 pages.
Non-Final Office Action for U.S. Appl. No. 16/689,236, dated Mar. 2, 2021, 15 pages.
Notice of Allowance for U.S. Appl. No. 16/689,236, dated Jun. 9, 2021, 7 pages.
Non-Final Office Action for U.S. Appl. No. 16/263,368, dated Aug. 7, 2020, 4 pages.
Non-Final Office Action for U.S. Appl. No. 16/263,368, dated Dec. 17, 2020, 8 pages.
Notice of Allowance for U.S. Appl. No. 16/263,368, dated Apr. 29, 2021, 7 pages.
Notice of Allowance for U.S. Appl. No. 16/508,704, dated Dec. 30, 2020, 7 pages.
Notice of Allowance for U.S. Appl. No. 16/508,768, dated Oct. 27, 2020, 9 pages.
Quayle Action for U.S. Appl. No. 16/514,339, mailed Nov. 19, 2020, 9 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.
Non-Final Office Action for U.S. Appl. No. 16/669,728, dated Jun. 3, 2021, 9 pages.
Final Office Action for U.S. Appl. No. 17/027,963, dated Jan. 14, 2022, 4 pages.
Notice of Allowance for U.S. Appl. No. 17/027,963, dated Mar. 30, 2022, 8 pages.
Notice of Allowance and Examiner-Initiated Interview Summary for U.S. Appl. No. 16/669,728, dated Dec. 8, 2021, 8 pages.
International Search Report and Written Opinion for International Patent Application No. PCT/US2020/043067, dated Nov. 11, 2020, 19 pages.
International Search Report and Written Opinion for International Patent Application No. PCT/US2021/052151, dated Jan. 4, 2022, 16 pages.
Extended European Search Report for European Patent Application No. 22152966.2, dated Jun. 23, 2022, 9 pages.
Extended European Search Report for European Patent Application No. 22195683.2, dated Feb. 10, 2023, 12 pages.
International Preliminary Report on Patentability for International Patent Application No. PCT/US2021/061721, dated Apr. 4, 2023, 21 pages.
International Search Report and Written Opinion for International Patent Application No. PCT/US2022/043600, dated Jan. 11, 2023, 15 pages.
Extended European Search Report for European Patent Application No. 22195382.1, dated Feb. 1, 2023, 26 pages.
International Search Report and Written Opinion for International Patent Application No. PCT/US2023/060303, dated Apr. 11, 2023, 12 pages.
Non-Final Office Action for U.S. Appl. No. 17/408,651, dated Mar. 2, 2023, 13 pages.
Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.
Notice of Allowance for U.S. Appl. No. 17/217,594, dated Apr. 2, 2023, 7 pages.
Notice of Allowance for U.S. Appl. No. 17/408,899, dated Feb. 24, 2023, 9 pages.
Written Opinion for International Patent Application No. PCT/US2021/061721, dated Mar. 1, 2023, 7 pages.
Extended European Search Report for European Patent Application No. 22200302.2, dated Mar. 1, 2023, 14 pages.

(56) References Cited

OTHER PUBLICATIONS

Extended European Search Report for European Patent Application No. 22200322.0, dated Mar. 1, 2023, 13 pages.
Extended European Search Report for European Patent Application No. 22200300.6, dated Feb. 24, 2023, 10 pages.
Extended European Search Report for European Patent Application No. 22200111.7, dated Feb. 20, 2023, 9 pages.
Notice of Allowance for U.S. Appl. No. 17/325,482, dated Nov. 30, 2022, 8 pages.
Final Office Action for U.S. Appl. No. 17/408,899, dated Dec. 27, 2022, 13 pages.
Non-Final Office Action for U.S. Appl. No. 17/700,700, dated Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, dated Feb. 14, 2023, 12 pages.
Extended European Search Report for European Patent Application No. 22196188.1, dated Feb. 2, 2023, 25 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, dated Aug. 28, 2023, 14 pages.
Extended European Search Report for European Patent Application No. 23153108.8, dated Jun. 20, 2023, 18 pages.
Notice of Allowance for U.S. Appl. No. 17/408,651, dated Jun. 23, 2023, 8 pages.
Notice of Allowance for U.S. Appl. No. 17/316,828, dated Sep. 13, 2023, 8 pages.
International Search Report and Written Opinion for International Patent Application No. PCT/US2023/019267, dated Aug. 3, 2023, 14 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, dated Dec. 22, 2023, 24 pages.
Non-Final Office Action for U.S. Appl. No. 17/689,232, dated Dec. 11, 2023, 27 pages.
Notice of Allowance and Examiner-Initiated Interview Summary for U.S. Appl. No. 17/737,300, dated Dec. 19, 2023, 12 pages.
Corrected Notice of Allowability for U.S. Appl. No. 17/737,300, dated Dec. 27, 2023, 8 pages.
Notice of Allowance for U.S. Appl. No. 17/700,700, dated Oct. 23, 2023, 9 pages.
Supplemental Notice of Allowability for U.S. Appl. No. 17/700,700, dated Nov. 8, 2023, 5 pages.
Extended European Search Report for European Patent Application No. 23174010.1, dated Oct. 10, 2023, 10 pages.

* cited by examiner

```
                            ┌─────────────────────────────────┐
                            │ COUPLE A DISTRIBUTED VOLTAGE MODULATION CIRCUIT (42) TO A POWER MANAGEMENT INTEGRATED CIRCUIT │
                   200 ──▶  │ (PMIC) (40) VIA A FIRST CONDUCTIVE TRACE (68) HAVING A FIRST INDUCTIVE TRACE IMPEDANCE ($Z_{TRACE1}$) │
                            │                                202                                │
                            └─────────────────────────────────┘
                                              │
                                              ▼
                            ┌─────────────────────────────────┐
                            │ COUPLE THE DISTRIBUTED VOLTAGE MODULATION CIRCUIT (42) TO A RESPECTIVE VOLTAGE INPUT (48) │
                            │ OF ONE OR MORE POWER AMPLIFIER CIRCUITS (44(1)-44(N)) VIA A SECOND CONDUCTIVE TRACE (70) │
                            │ HAVING A SECOND INDUCTIVE TRACE IMPEDANCE ($Z_{TRACE2}$) SUBSTANTIALLY SMALLER │
                            │ THAN THE FIRST INDUCTIVE TRACE IMPEDANCE ($Z_{TRACE1}$) │
                            │                                204                                │
                            └─────────────────────────────────┘
                                              │
                                              ▼
                            ┌─────────────────────────────────┐
                            │ RECEIVE, IN THE DISTRIBUTED VOLTAGE MODULATION CIRCUIT (42), A MODULATED TARGET VOLTAGE ($V_{TGT}$) │
                            │ INDICATING THAT A MODULATED VOLTAGE ($V_{CC}$) WILL CHANGE FROM A PRESENT VOLTAGE LEVEL ($V_{LP}$) │
                            │ IN A PRESENT TIME INTERVAL ($S_{N-1}$) TO A FUTURE VOLTAGE LEVEL ($V_{LF}$) IN AN UPCOMING TIME INTERVAL ($S_N$) │
                            │                                206                                │
                            └─────────────────────────────────┘
                                              │
                                              ▼
                            ┌─────────────────────────────────┐
                            │ CHANGE, IN THE DISTRIBUTED VOLTAGE MODULATION CIRCUIT (42), A MODULATED INITIAL VOLTAGE ($V_{AMP}$) │
                            │ PRIOR TO A START OF THE UPCOMING TIME INTERVAL ($S_N$) SUCH THAT THE MODULATED INITIAL VOLTAGE ($V_{AMP}$) │
                            │ CAN BE CHANGED TO THE FUTURE VOLTAGE LEVEL ($V_{LF}$) WITHIN A DEFINED TEMPORAL LIMIT │
                            │ FROM THE START OF THE UPCOMING TIME INTERVAL ($S_N$) │
                            │                                208                                │
                            └─────────────────────────────────┘
```

*FIG. 5*

DISTRIBUTED POWER MANAGEMENT CIRCUIT

RELATED APPLICATIONS

This application claims the benefit of U.S. provisional patent application Ser. No. 63/245,142 filed on Sep. 16, 2021, the disclosure of which is incorporated herein by reference in its entirety.

FIELD OF THE DISCLOSURE

The technology of the disclosure relates generally to a power management circuit distributed across multiple dies.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standards for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 µs.

TABLE 1

| SCS (KHz) | CP (µs) | OFDM Symbol Duration (µs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols.

SUMMARY

Embodiments of the disclosure relate to a distributed power management circuit. In embodiments disclosed herein, the distributed power management circuit can achieve multiple performance enhancing objectives simultaneously. More specifically, the distributed power management circuit can be configured to switch a modulated voltage from one voltage level to another within a very short switching window, reduce in-rush current required for switching the modulated voltage, and minimize a ripple in the modulated voltage, all at same time. As a result, the distributed power management circuit can be provided in a wireless device (e.g., smartphone) to enable very fast voltage switching across a wide modulation bandwidth (e.g., 400 MHz) with reduced power consumption and voltage distortion.

In one aspect, a distributed power management circuit is provided. The distributed power management circuit includes a distributed voltage modulation circuit. The distributed voltage modulation circuit includes a voltage output that outputs a modulated voltage. The distributed voltage modulation circuit also includes a voltage amplifier. The voltage amplifier is configured to generate a modulated initial voltage. The distributed voltage modulation circuit also includes a voltage offset circuit. The voltage offset circuit is coupled between the voltage amplifier and the voltage output. The voltage offset circuit is configured to raise the modulated initial voltage by a modulated offset voltage to thereby generate the modulated voltage. The distributed voltage modulation circuit also includes a control circuit. The control circuit is configured to receive a modulated target voltage indicating that the modulated voltage will change from a present voltage level in a present time interval to a future voltage level in an upcoming time interval. The control circuit is also configured to activate the voltage amplifier prior to a start of the upcoming time interval to thereby change the modulated initial voltage to the future voltage level within a defined temporal limit from the start of the upcoming time interval.

In another aspect, a distributed voltage modulation circuit is provided. The distributed voltage modulation circuit includes a voltage output that outputs a modulated voltage. The distributed voltage modulation circuit also includes a voltage amplifier. The voltage amplifier is configured to generate a modulated initial voltage. The distributed voltage modulation circuit also includes a voltage offset circuit. The voltage offset circuit is coupled between the voltage amplifier and the voltage output. The voltage offset circuit is configured to raise the modulated initial voltage by a modulated offset voltage to thereby generate the modulated voltage. The distributed voltage modulation circuit also includes a control circuit. The control circuit is configured to receive a modulated target voltage indicating that the modulated voltage will change from a present voltage level in a present time interval to a future voltage level in an upcoming time interval. The control circuit is also configured to activate the voltage amplifier prior to a start of the upcoming time interval to thereby change the modulated initial voltage to the future voltage level within a defined temporal limit from the start of the upcoming time interval.

In another aspect, a method for supporting distributed power management is provided. The method includes coupling a distributed voltage modulation circuit to a power management integrated circuit (PMIC) via a first conductive trace having a first inductive trace impedance. The method also includes coupling the distributed voltage modulation circuit to a respective voltage input of one or more power amplifier circuits via a second conductive trace having a second inductive trace impedance substantially smaller than the first inductive trace impedance. The method also includes receiving, in the distributed voltage modulation circuit, a modulated target voltage indicating that a modulated voltage will change from a present voltage level in a present time interval to a future voltage level in an upcoming time interval. The method also includes changing, in the distributed voltage modulation circuit, a modulated initial voltage prior to a start of the upcoming time interval such that the modulated initial voltage can be changed to the future voltage level within a defined temporal limit from the start of the upcoming time interval.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
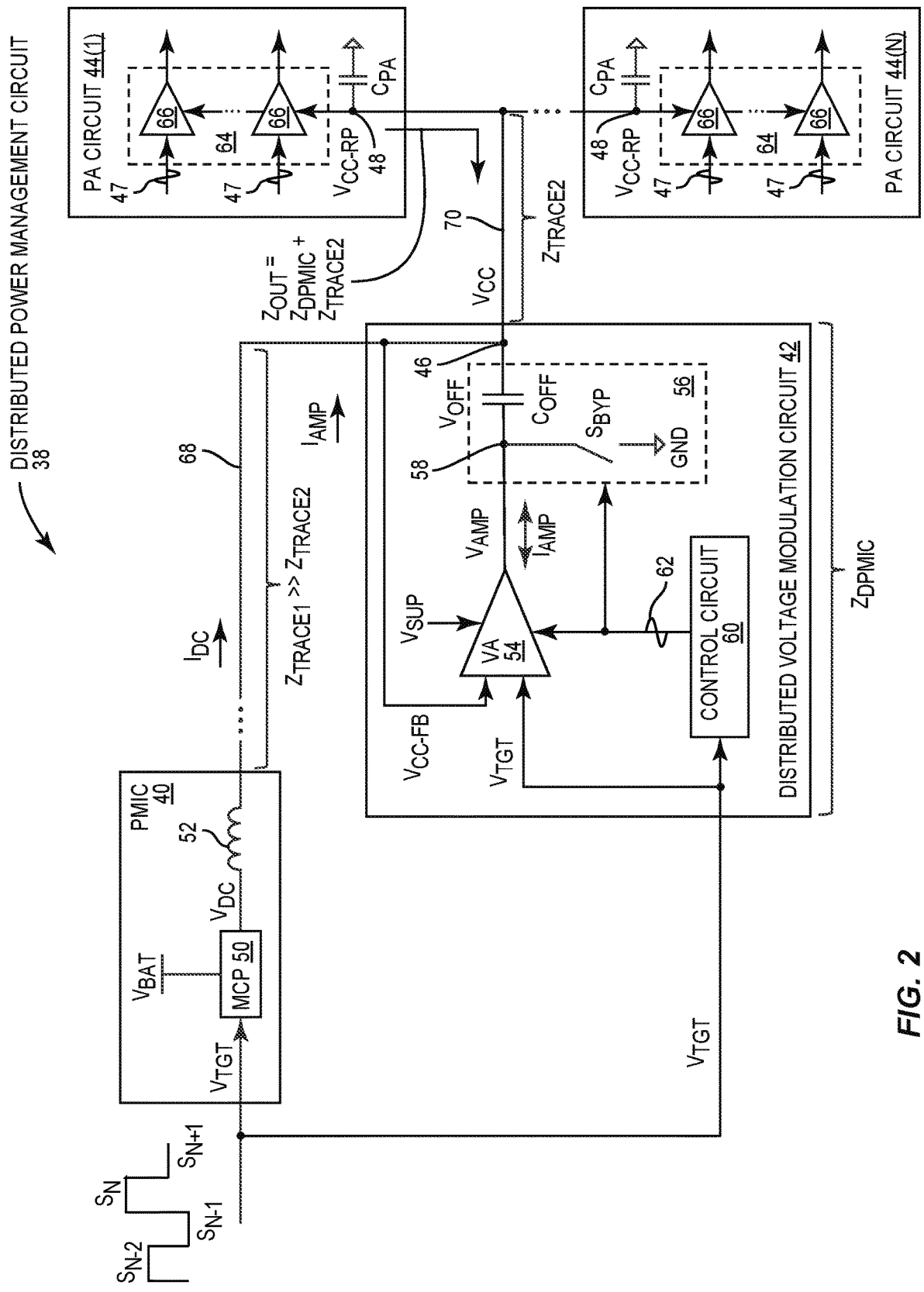
FIG. 2 is a schematic diagram of an exemplary distributed power management circuit configured according to embodiments of the present disclosure.
Figure 3A:
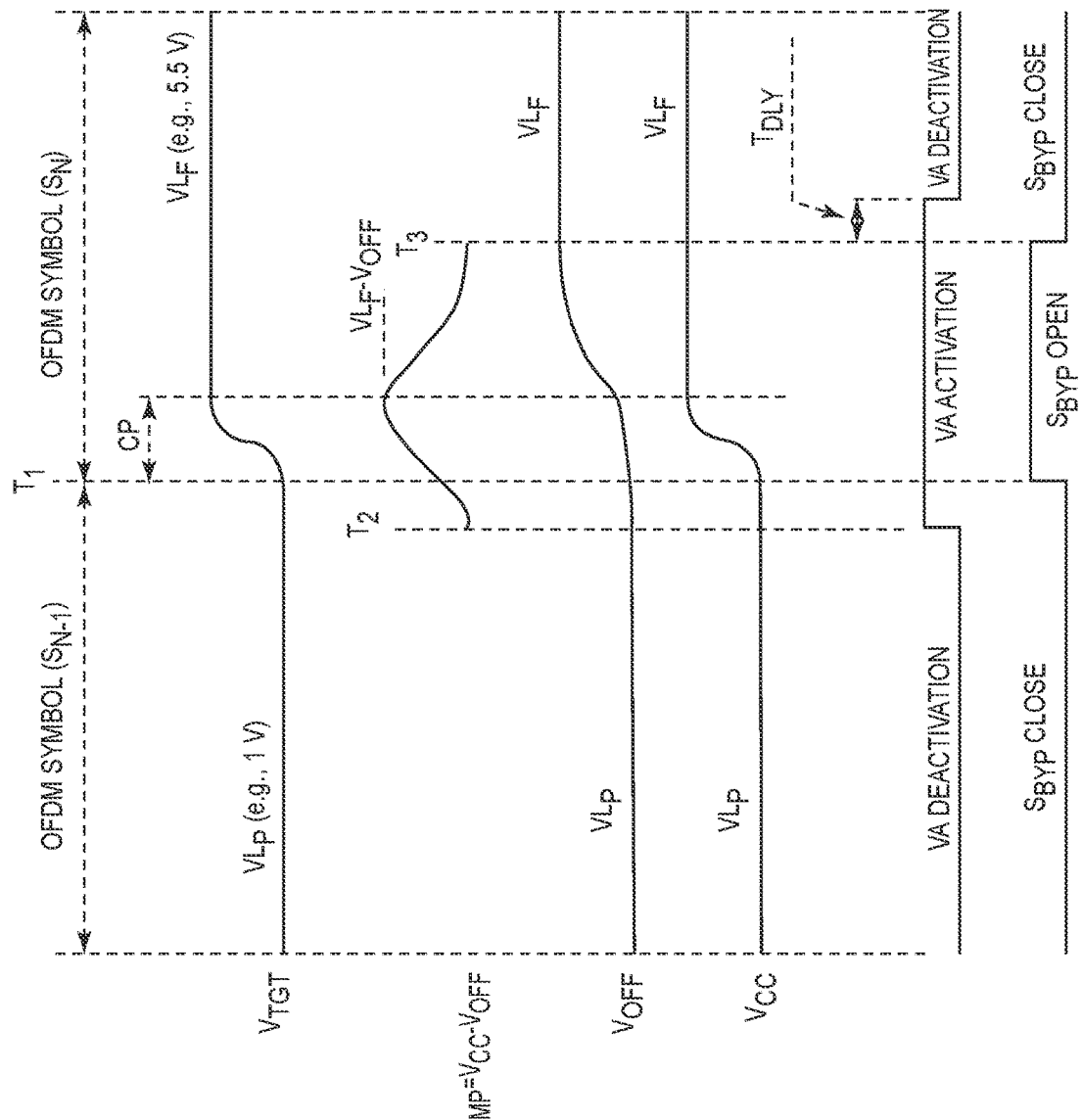
Figure 3B:
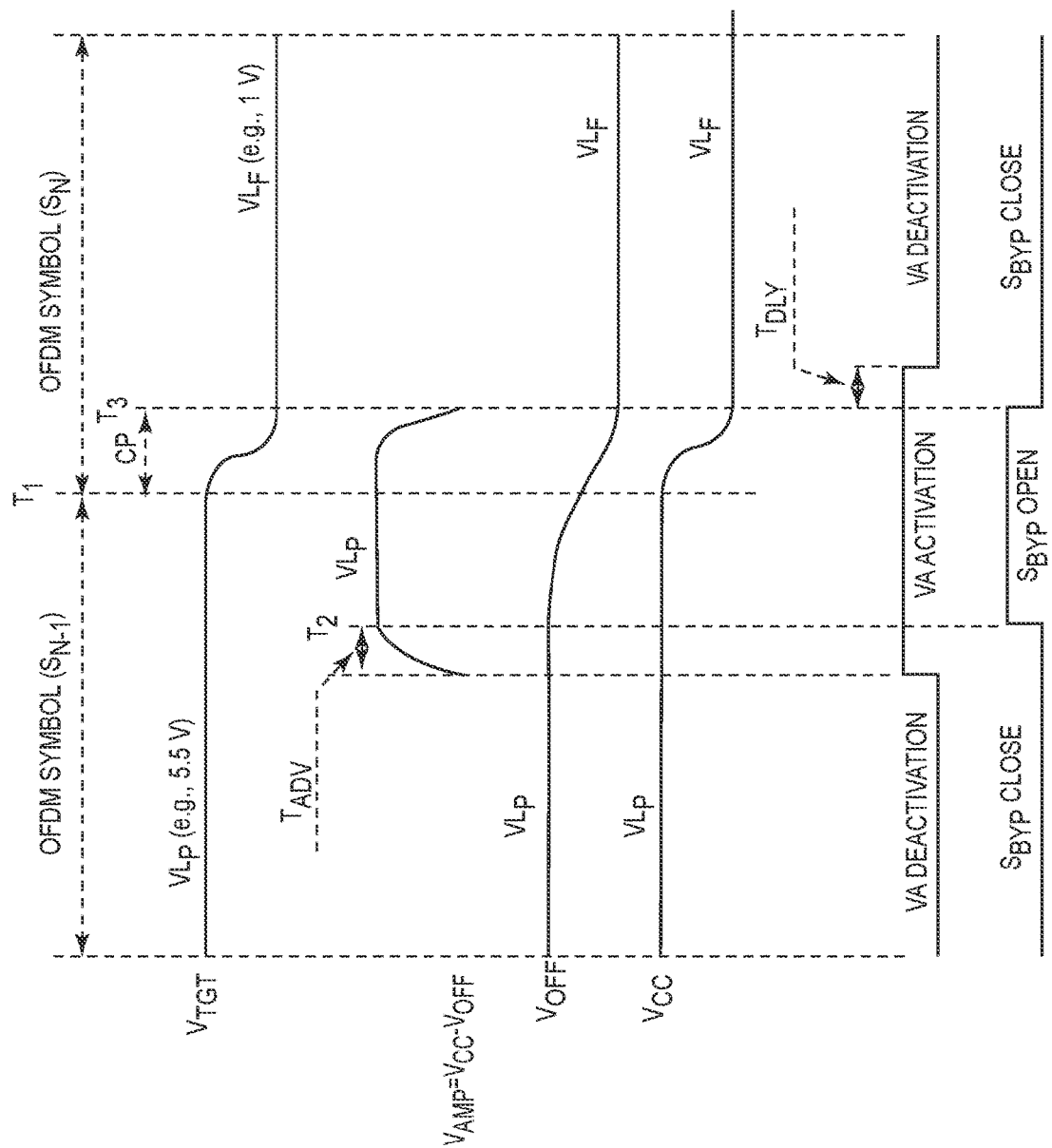
Figure 4:
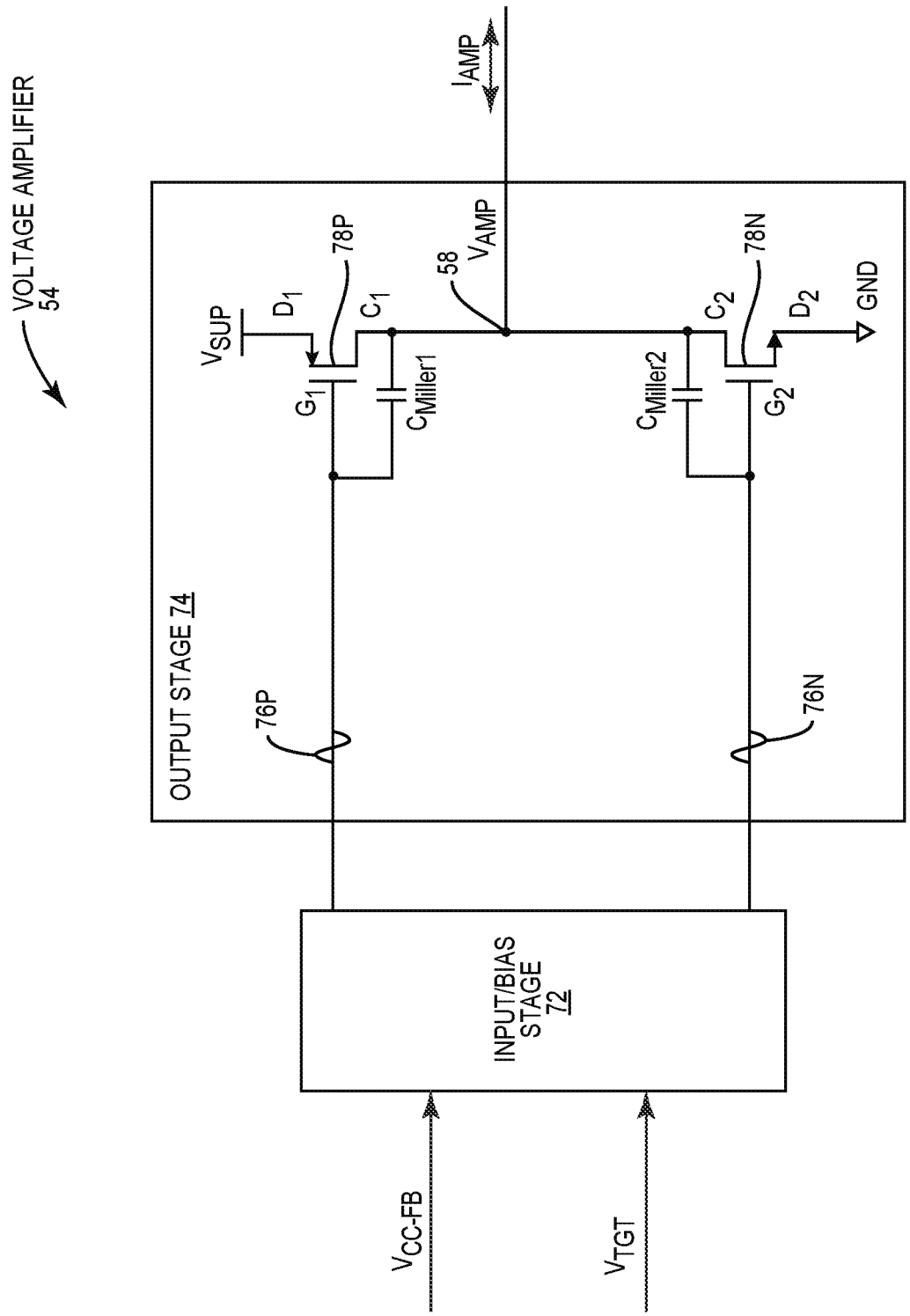

FIG. 3A is a timing diagram providing an exemplary illustration of the distributed power management circuit of FIG. 2 configured to increase a modulated voltage from a present voltage level in a present orthogonal frequency division multiplexing (OFDM) symbol to a future voltage level in an upcoming OFDM symbol; and FIG. 3B is a timing diagram providing an exemplary illustration of the distributed power management circuit of FIG. 2 configured to decrease an Average Power Tracking (APT) voltage from a present voltage level in a present OFDM symbol to a future voltage level in an upcoming OFDM symbol;

FIG. 4 is a schematic diagram providing an exemplary illustration of a voltage amplifier in the distributed power management circuit of FIG. 2; and FIG. 5 is a flowchart of an exemplary process for supporting distributed power management based on the distributed power management circuit of FIG. 2.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a distributed power management circuit. In embodiments disclosed herein, the distributed power management circuit can achieve multiple performance enhancing objectives simultaneously. More specifically, the distributed power management circuit can be configured to switch a modulated voltage from one voltage level to another within a very short switching window, reduce in-rush current required for switching the modulated voltage, and minimize a ripple in the modulated voltage, all at same time. As a result, the distributed power management circuit can be provided in a wireless device (e.g., smartphone) to enable very fast voltage switching across a wide modulation bandwidth (e.g., 400 MHz) with reduced power consumption and voltage distortion.

Before discussing the distributed power management circuit of the present disclosure, starting at FIG. 2, a brief discussion is first provided with reference to FIGS. 1A-1D to help understand several technical problems to be concurrently solved by the distributed power management circuit of the present disclosure.

Figure 1A:
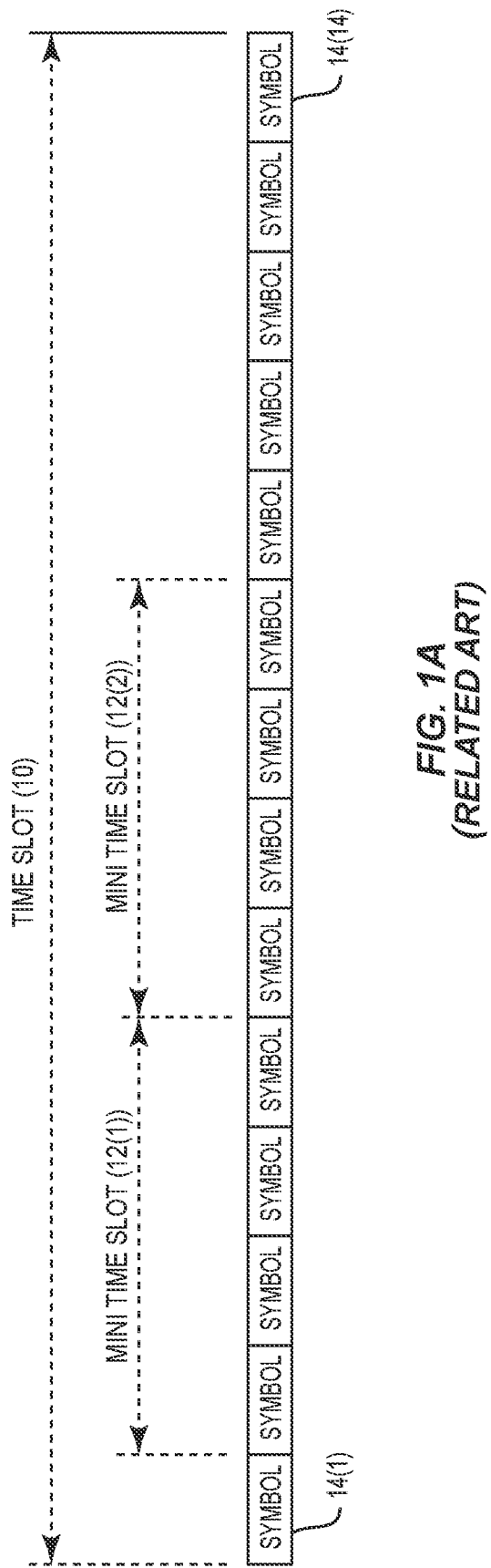
FIG. 1A illustrates an exemplary time slot(s) and a mini time slot(s) as widely supported in a fifth generation (5G) system.

FIG. 1A illustrates an exemplary time slot 10 and a pair of mini time slots 12(1)-12(2) as widely supported in a fifth generation (5G) and/or a 5G new-radio (5G-NR) system. The time slot(s) 10 is configured to include multiple symbols 14(1)-14 (14), such as orthogonal frequency division multiplexing (OFDM) symbols. The mini time slots 12(1)-12(2) can each include at least two of the symbols 14(1)-14(14). In the example shown in FIG. 1A, the mini time slots 12(1)-12(2) each includes four of the symbols 14(1)-14(14).

As previously shown in Table 1, each of the symbols 14(1)-14(14) has a symbol duration that depends on the subcarrier spacing (SCS) and starts with a cyclic prefix (CP) whose duration also depends on the SCS. In this regard, once the SCS is chosen, the symbol duration of the symbols 14(1)-14(14) and the duration of the CP in each of the symbols 14(1)-14(14) will be determined accordingly. Hereinafter, the symbol duration of the symbols 14(1)-14(14) and the CP duration of each of the symbols 14(1)-14(14) can be used to define "a time interval (e.g., a present or an upcoming time interval)" and "a defined temporal limit from a start of the time interval," respectively.

Understandably, the CP in each of the symbols 14(1)-14 (14) is designed to act as a buffer zone for any changes (e.g., voltage change) between any two consecutive ones of the symbols 14(1)-14(14). As such, one of the technical problems to be solved by the distributed power management circuit of the present disclosure is to ensure that a modulated voltage change (increase or decrease) between any two consecutive ones of the symbols 14(1)-14(14) can be made within the CP duration in each of the symbols 14(1)-14(14).

Figure 1B:
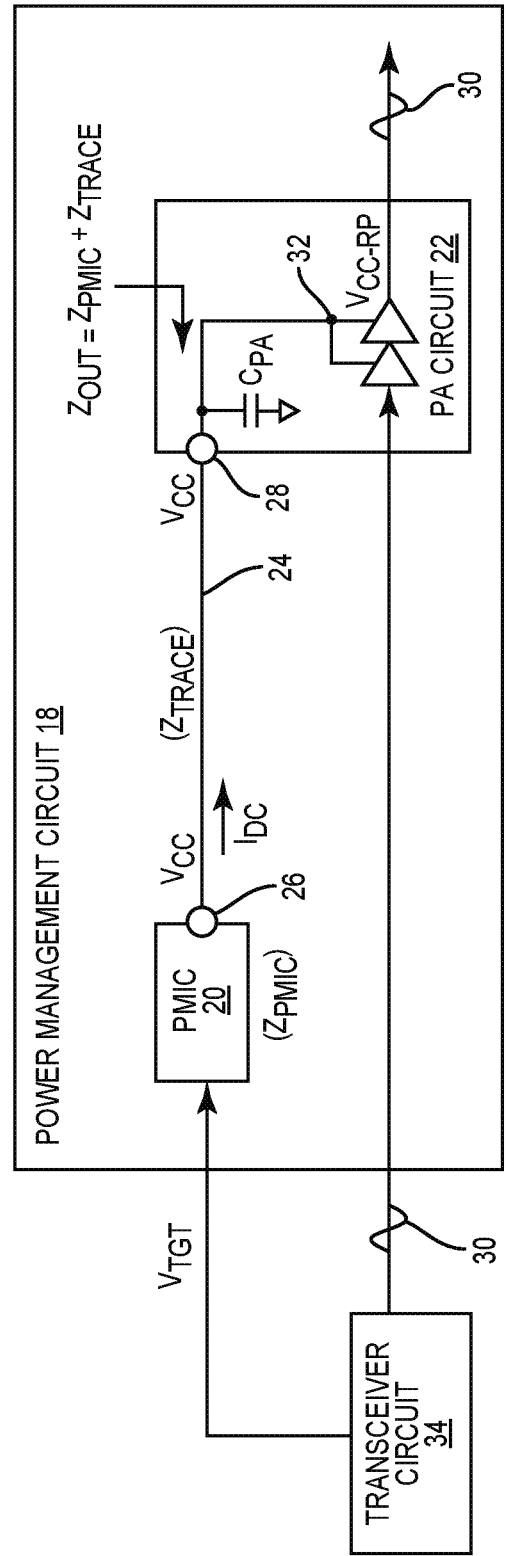
FIG. 1B is a schematic diagram of an exemplary existing transmission circuit wherein a power management circuit is configured to reduce a voltage ripple in a modulated voltage based on a conventional approach.

FIG. 1B is a schematic diagram of an exemplary existing transmission circuit 16 wherein a power management circuit 18 is configured to reduce a voltage ripple $V_{CC-RP}$ in a modulated voltage $V_{CC}$ based on a conventional approach. The power management circuit 18 includes a power management integrated circuit (PMIC) 20 and a power amplifier circuit 22. The PMIC 20 is configured to generate the modulated voltage $V_{CC}$ based on a modulated target voltage $V_{TGT}$ and provide the modulated voltage $V_{CC}$ to the power amplifier circuit 22 via a conductive path 24 (e.g., a conductive trace), which is coupled between a voltage output 26 of the PMIC 20 and a power amplifier input 28 of the power amplifier circuit 22. The power amplifier circuit 22 is configured to amplify a radio frequency (RF) signal 30 based on the modulated voltage $V_{CC}$.

Notably, there may be an internal routing distance from the power amplifier input 28 to an actual voltage input 32 (e.g., a collector node) of the power amplifier circuit 22. Given that the internal routing distance is far shorter than the conductive path 24, the internal routing distance is thus neglected hereinafter. Accordingly, the power amplifier input 28 as illustrated herein can be equated with the actual voltage input 32 of the power amplifier circuit 22.

The power management circuit 18 may be coupled to a transceiver circuit 34. Herein, the transceiver circuit 34 is configured to generate the RF signal 30 and the modulated target voltage $V_{TGT}$.

Figure 1C:
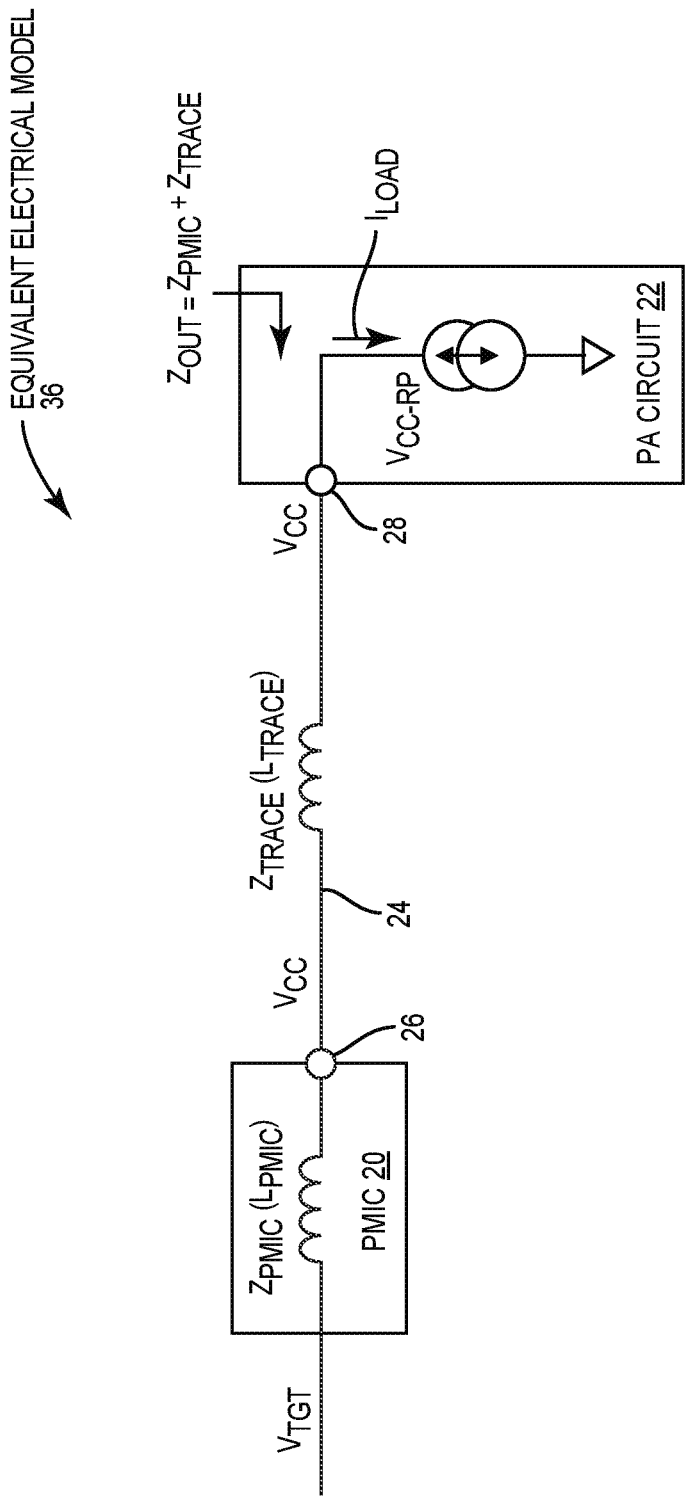
FIG. 1C is a schematic diagram of an exemplary electrical model of the power management circuit in FIG. 1B.

The voltage ripple $V_{CC-RP}$ can be quantitatively analyzed based on an equivalent electrical model of the power management circuit 18. In this regard, FIG. 1C is a schematic diagram of an exemplary equivalent electrical model 36 of the power management circuit 18 in FIG. 1A. Common elements between FIGS. 1B and 1C are shown therein with common element numbers and will not be re-described herein.

The PMIC 20 inherently has an inductive impedance $Z_{PMIC}$ that can be modeled by a PMIC inductance $L_{PMIC}$. The conductive path 24 can also be associated with an inductive trace impedance $Z_{TRACE}$ that can be modeled by a trace inductance $L_{TRACE}$. As a result, looking from the power amplifier input 28 toward the PMIC 20, the power amplifier circuit 22 will see an output impedance $Z_{OUT}$ that includes both the inductive impedance $Z_{PMIC}$ and the inductive trace impedance $Z_{TRACE}$ ($Z_{OUT}=Z_{PMIC}+Z_{TRACE}$).

The power amplifier circuit 22 can be modeled as a current source. In this regard, the power amplifier circuit 22 will modulate a load current $I_{LOAD}$ based on the modulated voltage $V_{CC}$. The load current $I_{LOAD}$ can interact with the output impedance $Z_{OUT}$ to create the voltage ripple $V_{CC-RP}$ in the modulated voltage $V_{CC}$ received at the power amplifier input 28. In this regard, the voltage ripple $V_{CC-RP}$ is a function of the modulated load current $I_{LOAD}$ and the output impedance $Z_{OUT}$, as expressed in equation (Eq. 1) below.

$$V_{CC-RP}=I_{LOAD}*Z_{OUT} \qquad \text{(Eq. 1)}$$

Notably from the equation (Eq. 1), it may be possible to reduce the voltage ripple $V_{CC-RP}$ by lowering the output impedance $Z_{OUT}$ seen at the power amplifier input 28. In this regard, the conventional approach for reducing the voltage ripple $V_{CC-RP}$ in the power management circuit 18 of FIG. 1B is to add a decoupling capacitor $C_{PA}$ inside the power amplifier circuit 22 and be as close to the power amplifier input 28 as possible. By adding the decoupling capacitor $C_{PA}$, the output impedance $Z_{OUT}$ can be simply expressed as in equation (Eq. 2).

$$Z_{OUT}=Z_{CPA}\|(Z_{PMIC}+Z_{TRACE}) \qquad \text{(Eq. 2)}$$

In the equation (Eq. 2), $ZC_{PA}$ represents a capacitive impedance of the decoupling capacitor $C_{PA}$. The capacitive impedance $Z_{CPA}$ and the inductive impedance $Z_{PMIC}$ and $Z_{TRACE}$ can each be determined according to equations (Eq. 3.1-3.3) below.

$$|Z_{CPA}|=1/2\pi f^*C_{PA} \tag{Eq. 3.1}$$

$$|Z_{PMIC}|=2\pi f^*L_{PMIC} \tag{Q. 3.2}$$

$$|Z_{TRACE}|=2\pi f^*L_{TRACE} \tag{Eq. 3.3}$$

Figure 1D:
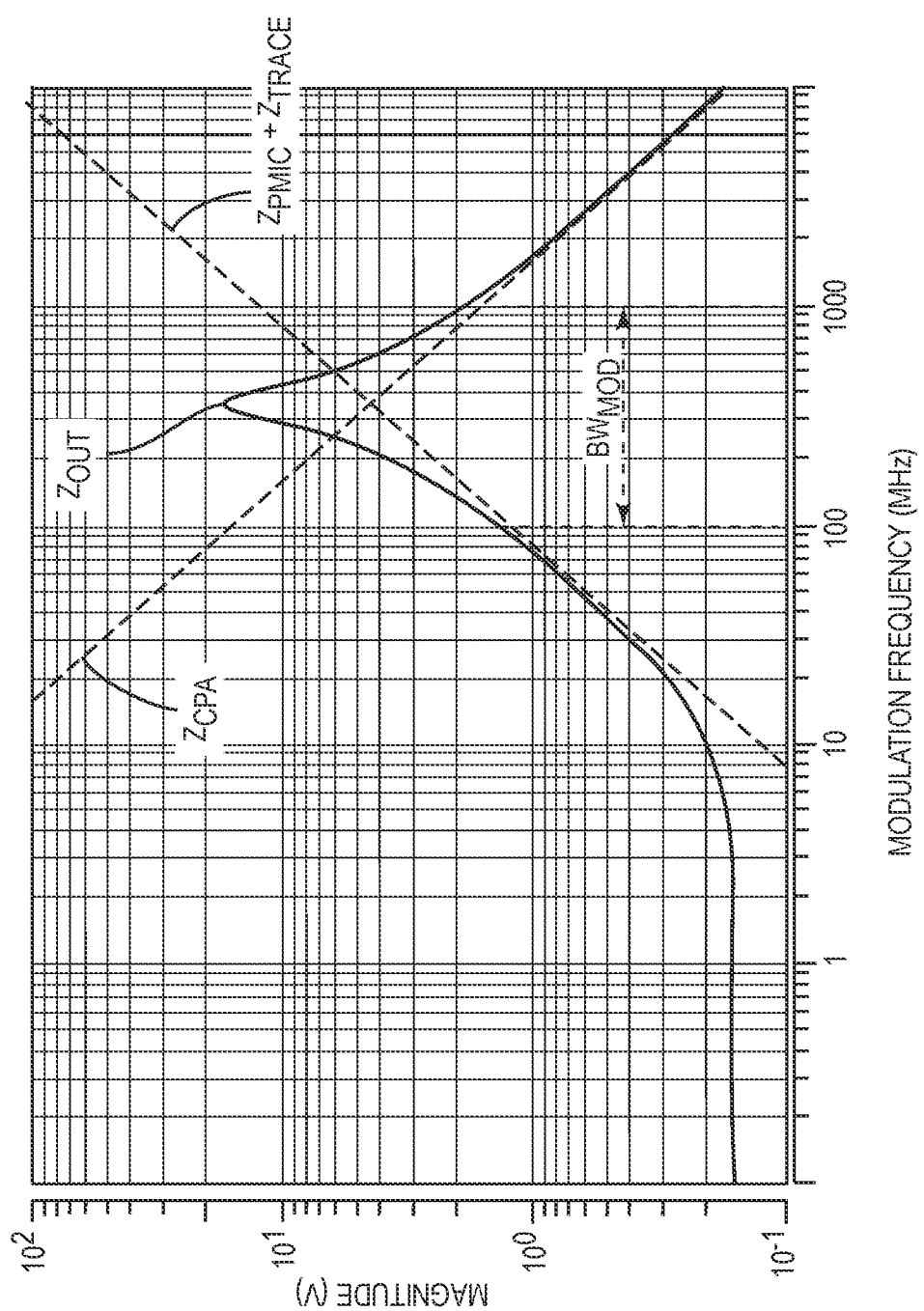
FIG. 1D is a graphic diagram providing an exemplary illustration of magnitude impedance as a function of modulation frequency.

In the equations (Eq. 3.1-3.3), f represents the modulation frequency of the load current $I_{LOAD}$. In this regard, the capacitive impedance $Z_{CPA}$, the inductive impedance $Z_{PMIC}$, and the inductive trace impedance $Z_{TRACE}$ are each a function of the modulation frequency f. FIG. 1D is a graphic diagram providing an exemplary illustration of magnitude impedance vs. the modulation frequency f.

When the modulation frequency f is lower than 10 MHz, the output impedance $Z_{OUT}$ is dominated by a real part of the inductive impedance $Z_{PMIC}$ and a real part of the inductive trace impedance $Z_{TRACE}$. Between 10 MHz and 100 MHz, the output impedance $Z_{OUT}$ is dominated by the inductive impedance $Z_{PMIC}$ and the inductive trace impedance $Z_{TRACE}$. Above 1000 MHz, the output impedance $Z_{OUT}$ will be dominated by the capacitive impedance $Z_{CPA}$.

Herein, a modulation bandwidth $BW_{MOD}$ of the RF signal 30 may fall between 100 MHz and 1000 MHz (e.g., 100-500 MHz). In this frequency range, the output impedance $Z_{OUT}$ will be determined by the output impedance $Z_{OUT}$ as expressed in equation (Eq. 2).

Notably from equations (Eq. 2 and 3.1), the capacitive impedance $Z_{CPA}$, and therefore the output impedance $Z_{OUT}$, will decrease as the capacitance $C_{PA}$ increases. In this regard, the conventional approach for reducing the ripple voltage $V_{CC-RP}$ relies largely on adding the decoupling capacitor $C_{PA}$ with a larger capacitance (e.g., 1 to 2 µF). However, doing so can cause some obvious issues.

Understandably, a rate of change of the modulated voltage $V_{CC}$ ($\Delta V_{CC}$ or dV/dt) can be inversely affected by the capacitance of the decoupling capacitor $C_{PA}$, as shown in equation (Eq. 4) below.

$$\Delta V_{CC}=I_{DC}/C_{PA} \tag{Eq. 4}$$

In the equation (Eq. 4), $I_{DC}$ represents a low-frequency current (a.k.a. in-rush current) provided by the PMIC 20 when the decoupling capacitor $C_{PA}$ is charged or discharged. In this regard, the larger capacitance the decoupling capacitor $C_{PA}$ has, the larger amount of the low-frequency current $I_{DC}$ would be needed to change the modulated voltage $V_{CC}$ at a required rate of change ($\Delta V_{CC}$). As a result, the existing transmission circuit 16 may cause a negative impact on battery life.

If the low-frequency current $I_{DC}$ is kept at a low level to prolong battery life, the existing transmission circuit 16 may have difficulty meeting the required rate of change ($\Delta V_{CC}$), particularly when the RF signal 30 is modulated based on OFDM for transmission in a millimeter wave (mmWave) spectrum.

Consequently, the existing transmission circuit 16 may not be able to change the modulated voltage $V_{CC}$ between any two consecutive ones of the symbols 14(1)-14(14) that can be made within the CP duration in each of the symbols 14(1)-14(14).

On the other hand, if the capacitance of the decoupling capacitor $C_{PA}$ is reduced to help improve the rate of change ($\Delta V_{cc}$) of the modulated voltage $V_{CC}$ and reduce the in-rush current $I_{DC}$, then the output impedance $Z_{OUT}$ may become too large to cause the voltage ripple $V_{CC-RP}$. In this regard, another one of the technical problems to be solved by the distributed power management circuit of the present disclosure is to reduce the in-rush current without causing the voltage ripple $V_{CC-RP}$.

In this regard, FIG. 2 is a schematic diagram of an exemplary distributed power management circuit 38 configured according to embodiments of the present disclosure. Herein, the distributed power management circuit 38 includes a PMIC 40, a distributed voltage modulation circuit 42, and one or more power amplifier circuits 44(1)-44(N). In an embodiment, the PMIC 40 and the distributed voltage modulation circuit 42 are provided in different dies. The power amplifier circuits 44(1)-44(N), on the other hand, can be provided in a same die or in multiple different dies.

The distributed voltage modulation circuit 42 is configured to generate a modulated voltage $V_{CC}$ at a voltage output 46 based on a modulated target voltage $V_{TGT}$, which may be received from a transceiver circuit (not shown) via an RF front-end (RFFE) interface. The PMIC 40 is configured to generate a low-frequency current (a.k.a. in-rush current) $I_{DC}$ to assist in switching the modulated voltage $V_{CC}$ from one voltage level to another. The power amplifier circuits 44(1)-44(N) are each configured to amplify one or more RF signals 47 based on the modulated voltage $V_{CC}$. Similar to the power amplifier circuit 22 in FIG. 1B, the power amplifier circuits 44(1)-44(N) can each see a ripple voltage $V_{CC-RP}$ at a respective voltage input 48 due to an output impedance $Z_{OUT}$ presenting at the respective voltage input 48.

As discussed in detail below, the distributed power management circuit 38 can switch a modulated voltage $V_{CC}$ from one voltage level to another between any pair of consecutive time intervals (e.g., OFDM symbols) $S_{N-1}$, $S_N$. The distributed power management circuit 38 can also reduce the in-rush current $I_{DC}$ required for switching the modulated voltage $V_{CC}$ between the consecutive time intervals $S_{N-1}$, $S_N$. The distributed power management circuit 38 can also suppress the ripple voltage $V_{CC-RP}$ by reducing the output impedance $Z_{OUT}$ seen by the power amplifier circuits 44(1)-44(N). More importantly, the distributed power management circuit 38 can perform fast switching of the modulated voltage $V_{CC}$, reduce the in-rush current $I_{DC}$, and suppress the ripple voltage $V_{CC-RP}$ all at a same time. In this regard, the distributed power management circuit 38 can solve all the technical problems as previously identified in the power management circuit 18 of FIG. 1B.

The PMIC 40 includes a multi-level charge pump (MCP) 50 configured to generate a low-frequency voltage $V_{DC}$ as a function of a battery voltage $V_{BAT}$. For example, the MCP 50 can be a buck-boost direct-current (DC) to DC (DC-DC) converter that toggles between a buck mode and a boost mode based on a duty cycle. When operating in the buck mode, the MCP 50 can generate the low-frequency voltage $V_{DC}$ at $0 \times V_{BAT}$ or $1 \times V_{BAT}$. When operating in the boost mode, the MCP 50 can generate the low-frequency voltage $V_{DC}$ at $2 \times V_{BAT}$. Thus, by toggling between $0 \times V_{BAT}$, $1 \times V_{BAT}$, and $2 \times V_{BAT}$ based on the duty cycle, the MCP 50 can generate the low-frequency voltage $V_{DC}$ at any desired voltage level. In a non-limiting example, the duty cycle can be determined based on the modulated target voltage $V_{TGT}$ that indicates how the modulated voltage $V_{CC}$ will change (increase or decrease) from the preceding time interval $S_{N-1}$ to the succeeding time interval $S_N$.

The PMIC 40 also includes a power inductor 52. Herein, the power inductor 52 is configured to generate the low-frequency current (a.k.a. in-rush current) $I_{DC}$ to assist in switching the modulated voltage $V_{CC}$ from a present voltage level in the time interval $S_{N-1}$ to a future voltage level in the time interval $S_N$.

The distributed voltage modulation circuit 42 includes a voltage amplifier 54 and a voltage offset circuit 56. As such, the distributed voltage modulation circuit 42 can have an inherent impedance $Z_{DPMIC}$, which is equivalent to the impedance $Z_{PMIC}$ in FIG. 1B. The voltage amplifier 54 is configured to generate a modulated initial voltage $V_{AMP}$ based on the modulated voltage $V_{TGT}$ and a supply voltage $V_{SUP}$. The voltage offset circuit 56 is coupled between an output 58 of the voltage amplifier 54 and the voltage output 46. In an embodiment, the voltage offset circuit 56 includes an offset capacitor $C_{OFF}$ that is coupled between the output 58 of the voltage amplifier 54 and the voltage output 46, and a bypass switch $S_{BYP}$ coupled between the output 58 of the voltage amplifier 54 and a ground (GND).

The offset capacitor $C_{OFF}$ is configured to raise the modulated initial voltage $V_{AMP}$ by an offset voltage $V_{OFF}$ to generate the modulated voltage $V_{CC}$ at the voltage output 46 ($V_{CC}=V_{AMP}+V_{OFF}$). The offset voltage $V_{OFF}$ can be modulated by charging or discharging the offset capacitor $C_{OFF}$ in accordance with an increase or decrease of the modulated voltage $V_{CC}$. In a non-limiting example, the offset voltage $V_{OFF}$ can be modulated in accordance with equation (Eq. 5) below.

$$V_{OFF}=V_{CC\text{-}MIN}N_{HEAD} \qquad (Eq.\ 5)$$

In the equation (Eq. 5) above, $V_{CC\text{-}MIN}$ represents a minimum level of the modulated voltage $V_{CC}$ in any of the time intervals, such as time intervals $S_{N-2}$, $S_{N-1}$, $S_N$, and $S_{N+1}$ illustrated herein. $N_{HEAD}$ represents a bottom headroom voltage. Given that $N_{HEAD}$ is typically fixed, the offset voltage $V_{OFF}$ will fluctuate in accordance with the $V_{CC\text{-}MIN}$. As such, the offset capacitor $C_{OFF}$ needs to be charged when the $V_{CC\text{-}MIN}$ increases and discharged when the $V_{CC\text{-}MIN}$ decreases. According to an embodiment, the bypass switch $S_{BYP}$ is closed to allow the offset capacitor $C_{OFF}$ to be charged and opened to allow the offset capacitor $C_{OFF}$ to be discharged.

The distributed voltage modulation circuit 42 also includes a control circuit 60, which can be a field-programmable gate array (FPGA), an application-specific integrated circuit (ASIC), or a bang-bang controller, as an example. As discussed in the examples in FIGS. 3A and 3B, the control circuit 60 can selectively activate/deactivate the voltage amplifier 54 and open/close the bypass switch $S_{BYP}$ to cause the modulated voltage $V_{CC}$ to change (increase or decrease) between the consecutive time intervals $S_{N-1}$, $S_N$. In a non-limiting example, the control circuit 60 can control the voltage amplifier 54 and the bypass switch $S_{BYP}$ via a control signal 62.

FIG. 3A is a timing diagram providing an exemplary illustration of the distributed power management circuit 38 of FIG. 2 configured to increase the modulated voltage $V_{CC}$ from a present voltage level $VL_P$ in an OFDM symbol $S_{N-1}$ (also referred to as "a present OFDM symbol" or "present time interval") to a future voltage level $VL_F$ in an OFDM symbol $S_N$ (also referred to as "an upcoming OFDM symbol" or "upcoming time interval"). Common elements between FIGS. 2 and 3A are shown therein with common element numbers and will not be re-described herein.

Herein, the control circuit 60 receives the target voltage $V_{TGT}$ during the OFDM symbol $S_{N-1}$ and prior to a start time $T_1$ of the OFDM symbol $S_N$. The target voltage $V_{TGT}$ indicates that the modulated voltage $V_{CC}$ is set to increase from the present voltage level $VL_P$ (e.g., 1 V) in the OFDM symbol $S_{N-1}$ to the future voltage level $VL_F$ (e.g., 5.5 V) in the OFDM symbol $S_N$. Notably, during the OFDM symbol $S_{N-1}$, the bypass switch $S_{BYP}$ is closed and the offset capacitor $C_{OFF}$ is charged to maintain the modulated voltage $V_{CC}$ at the present voltage level $VL_P$.

Prior to the start time $T_1$ of the OFDM symbol $S_N$ (e.g., at time $T_2$), the control circuit 60 activates the voltage amplifier 54 to generate the modulated initial voltage $V_{AMP}$ and source a high-frequency current $I_{Amp}$ (e.g., an alternating current). In a non-limiting example, the time $T_2$ can be so determined to account for ramping up and settling time of the voltage amplifier 54. In addition, the time $T_2$ can be further determined to ensure that the voltage amplifier 54 can ramp up the modulated initial voltage $V_{AMP}$ to a level substantially equal ($VL_F-V_{OFF}$) within the CP duration of the OFDM symbol $S_N$.

Concurrent to generating the modulated initial voltage $V_{AMP}$ to quickly raise the modulated voltage $V_{CC}$ to the level of ($VL_F-V_{OFF}$), the high-frequency current $I_{AMP}$ will charge up a load capacitor $C_{PA}$ to help maintain the modulated voltage $V_{CC}$ at the level of ($VL_F-V_{OFF}$). The load capacitor $C_{PA}$, which may be provided inside or outside each of the power amplifier circuits 44(1)-44(N), has a smaller capacitance (e.g., 100 pF). As a result, according to equation (Eq. 4), it is possible to charge up the load capacitor $C_{PA}$ quickly with a reduced amount of the low-frequency current $I_{DC}$.

At the start time $T_1$ of the OFDM symbol $S_N$, the control circuit 60 opens the bypass switch $S_{BYP}$ such that the offset capacitor $C_{OFF}$ can be charged by the low-frequency current $I_{DC}$ to raise the offset voltage $V_{OFF}$ from the present voltage level $VL_P$ to the future voltage level $VL_F$. Given that the modulated voltage $V_{CC}$ has already been raised by the voltage amplifier 54 and maintained by the load capacitor $C_{PA}$, it is thus possible to charge the offset capacitor $C_{OFF}$ at a slower rate to help further reduce demand for the low-frequency current $I_{DC}$ (a.k.a., rush current). As the offset voltage $V_{OFF}$ gradually increases, the voltage amplifier 54 can gradually reduce the modulated initial voltage $V_{AMP}$ such that a sum of the modulated initial voltage $V_{AMP}$ and the offset voltage $V_{OFF}$ would equal the future voltage level $VL_F$.

At time $T_3$, the offset voltage $V_{OFF}$ is raised to the future voltage value $VL_F$. In this regard, the modulated initial voltage $V_{AMP}$ is no longer needed. Accordingly, the control circuit 60 can close the bypass switch $S_{BYP}$ and deactivate the voltage amplifier 54. In one embodiment, the control circuit 60 may close the bypass switch $S_{BYP}$ and deactivate the voltage amplifier 54 concurrently at time $T_3$. Alternatively, the control circuit 60 may deactivate the voltage amplifier 54 with a timing delay $T_{DLY}$ from closing the bypass switch $S_{BYP}$.

FIG. 3B is a timing diagram providing an exemplary illustration of the distributed power management circuit 38 of FIG. 2 configured to decrease the modulated voltage $V_{CC}$ from a present voltage level $VL_P$ in OFDM symbol $S_{N-1}$ (also referred to as "a present OFDM symbol") to a future voltage level $VL_F$ in OFDM symbol $S_N$ (also referred to as "an upcoming OFDM symbol"). Common elements between FIGS. 2 and 3B are shown therein with common element numbers and will not be re-described herein.

Herein, the control circuit 60 receives the target voltage $V_{TGT}$ during the OFDM symbol $S_{N-1}$ and prior to a start time $T_1$ of the OFDM symbol $S_N$. The target voltage $V_{TGT}$ indicates that the modulated voltage $V_{CC}$ is set to decrease from the present voltage level $VL_P$ (e.g., 5.5 V) in the OFDM symbol $S_{N-1}$ to the future voltage level $VL_F$ (e.g., 1 V) in the OFDM symbol $S_N$. Notably, during the OFDM symbol $S_{N-1}$, the bypass switch $S_{BYP}$ is closed and the offset capacitor $C_{OFF}$ is charged to maintain the modulated voltage $V_{CC}$ at the present voltage level $VL_P$.

Prior to the start time $T_1$ of the OFDM symbol $S_N$ (e.g., at time $T_2$), the control circuit 60 opens the bypass switch $S_{BYP}$ to discharge the offset capacitor $C_{OFF}$ to reduce the offset voltage $V_{OFF}$ from the present voltage level $VL_P$ to the future voltage level $VL_F$. The time $T_2$ may be so determined to ensure that the offset voltage $V_{OFF}$ can be reduced to the future voltage level $VL_F$ within the CP duration of the OFDM symbol $S_N$.

Notably, the distributed voltage modulation circuit 42 still needs to maintain the modulated voltage $V_{CC}$ at the present voltage level $VL_P$ during the OFDM symbol $S_{N-1}$ while the offset capacitor $C_{OFF}$ is discharged to reduce the offset voltage $V_{OFF}$. In this regard, the control circuit 60 is further configured to activate the voltage amplifier 54 to help maintain the modulated voltage $V_{CC}$ at the present voltage level $VL_P$ before discharging the offset capacitor $C_{OFF}$. In addition, the voltage amplifier 54 also serves as a current sink to absorb discharge current associated with discharging the offset capacitor $C_{OFF}$. The control circuit 60 may activate the voltage amplifier 54 with a timing advance $T_{ADV}$ before opening the bypass switch $S_{BYP}$ to start discharging the offset capacitor $C_{OFF}$. The timing advance $T_{ADV}$ may be so determined to ensure that the voltage amplifier 54 can be ramped up and settled to maintain the modulated voltage $V_{CC}$ at the present voltage level $VL_P$ by the time $T_2$.

At time $T_3$, the offset voltage $V_{OFF}$ is reduced to the future voltage value $VL_F$. In this regard, the modulated initial voltage $V_{AMP}$ is no longer needed. Accordingly, the control circuit 60 can close the bypass switch $S_{BYP}$ and deactivate the voltage amplifier 54. In one embodiment, the control circuit 60 may close the bypass switch $S_{BYP}$ and deactivate the voltage amplifier 54 concurrently at time $T_3$. Alternatively, the control circuit 60 may deactivate the voltage amplifier 54 with a timing delay $T_{DLY}$ from closing the bypass switch $S_{BYP}$.

With reference back to FIG. 2, each of the power amplifier circuits 44(1)-44(N) includes a respective amplifier circuit 64. Notably, each of the amplifier circuits 64 can include one or more power amplifiers 66 for concurrently amplifying the RF signals 47 based on a modulated voltage $V_{CC}$ for concurrent transmission via multiple antennas (not shown) according to such transmission schemes as multiple-input multiple-output (MIMO) and RF beamforming.

Each of the power amplifier circuits 44(1)-44(N) includes the respective load capacitor $C_{PA}$ (a.k.a. decoupling capacitor) coupled to the respective voltage input 48. As previously described, the load capacitor $C_{PA}$ is chosen to be smaller (e.g., 100 pF) to allow fast switching of the modulated voltage $V_{CC}$ between OFDM symbols $S_{N-1}$ and $S_N$. However, the smaller load capacitor $C_{PA}$ will also have a smaller capacitive impedance $Z_{CPA}$, which may not be enough to properly match the output impedance $Z_{OUT}$ presenting at the voltage input 48. Consequently, the ripple voltage $V_{CC-RP}$ may be created in the modulated voltage $V_{CC}$ received at the voltage input 48. In this regard, the distributed power management circuit 38 is also configured to suppress the ripple voltage $V_{CC-RP}$.

In an embodiment, the voltage output 46 in the distributed voltage modulation circuit 42 is coupled to the power inductor 52 via a first conductive trace 68 having a first inductive trace impedance $Z_{TRACE1}$, and to the respective voltage input 48 in each of the power amplifier circuits 44(1)-44(N) via a second conductive trace 70 having a second inductive trace impedance $Z_{TRACE2}$. Accordingly, the output impedance $Z_{OUT}$ seen at the respective voltage input 48 would include both the inherent impedance $Z_{DPMIC}$ of the distributed voltage modulation circuit 42 and the second inductive trace impedance $Z_{TRACE2}$ of the second conductive trace 70. Thus, to reduce the output impedance $Z_{OUT}$ to help suppress the ripple voltage $V_{CC-RP}$, it is necessary to reduce both the inherent impedance $Z_{DPMIC}$ and the second inductive trace impedance $Z_{TRACE2}$.

In one aspect, it is possible to reduce the second inductive trace impedance $Z_{TRACE2}$ by providing the distributed voltage modulation circuit 42 substantially close to the respective voltage input 48 of the power amplifier circuits 44(1)-44(N). In an embodiment, the distributed voltage modulation circuit 42 can be provided close enough to the respective voltage input 48 such that the second inductive trace impedance $Z_{TRACE2}$ is less than 0.7 nanohenry (nH). In contrast, since the PMIC 40 is only providing the low-frequency current $I_{DC}$, the first conductive trace 68 can be substantially longer (e.g., 50 times longer) than the second conductive trace 70. In other words, the PMIC 40 can be provided farther away from the respective voltage input 48 to provide more implementation flexibilities.

In another aspect, it is possible to reduce the inherent impedance $Z_{DPMIC}$ inside the voltage amplifier 54. In this regard, FIG. 4 is a schematic diagram providing an exemplary illustration of an inner structure of the voltage amplifier 54 in the distributed voltage modulation circuit 42 in FIG. 2. Common elements between FIGS. 2 and 4 are shown therein with common element numbers and will not be re-described herein.

In an embodiment, the voltage amplifier 54 includes an input/bias stage 72 and an output stage 74. The input/bias stage 72 is configured to receive the modulated voltage $V_{TGT}$ and a feedback signal $V_{CC-FB}$ indicating the modulated voltage $V_{CC}$ at the voltage output 46. Accordingly, the input/bias stage 72 generates a pair of bias signals 76P (a.k.a. first bias signal), 76N (a.k.a. second bias signal) to control the output stage 74.

In an embodiment, the output stage 74 is configured to generate the modulated initial voltage $V_{AMP}$ at the output 58 based on a selected one of the bias signals 76P, 76N. The output stage 74 is also configured to receive the feedback signal $V_{CC-FB}$. Accordingly, the output stage 74 can modify the modulated initial voltage $V_{AMP}$ based on the feedback signal $V_{CC-FB}$ to reduce the inherent impedance $Z_{DPMIC}$ to thereby reduce the output impedance $Z_{OUT}$.

In an embodiment, the output stage 74 includes a first transistor 78P and a second transistor 78N. In a non-limiting example, the first transistor 78P is a p-type field-effect transistor (pFET) and the second transistor 78N is an n-type FET (nFET). In this example, the first transistor 78P includes a first source electrode $C_1$, a first drain electrode $D_1$, and a first gate electrode $G_1$, and the second transistor 78N includes a second source electrode $C_2$, a second drain electrode $D_2$, and a second gate electrode $G_2$. Specifically, the first drain electrode $D_1$ is configured to receive the supply voltage $V_{SUP}$, the second drain electrode $D_2$ is coupled to a ground (GND), and the first source electrode $C_1$ and the second source electrode $C_2$ are both coupled to the output 58 of the voltage amplifier 54.

The first gate electrode $G_1$ is coupled to the input/bias stage 72 to receive the bias signal 76P and the second gate electrode $G_2$ is coupled to the input/bias stage 72 to receive the bias signal 76N. Herein, the input/bias stage 72 is configured to generate the bias signal 76P in response to an increase of the modulated voltage $V_{CC}$ or generate the bias signal 76N in response to a decrease of the modulated voltage $V_{CC}$. Specifically, the first transistor 78P will be turned on to output the modulated initial voltage $V_{AMP}$ and source the high-frequency current $I_{AMP}$ (e.g., an alternating current) from the supply voltage $V_{SUP}$ in response to receiving the bias signal 76P, and the second transistor 78N will be turned on to output the modulated initial voltage $V_{AMP}$ from the supply voltage $V_{SUP}$ and sink the high-frequency current $I_{AMP}$ to the GND in response to receiving the bias signal 76N.

In this embodiment, the output stage 74 also includes a first Miller capacitor $C_{Miller1}$ and a second Miller capacitor $C_{Miller2}$. Specifically, the first Miller capacitor $C_{Miller1}$ is coupled between the output 58 of the voltage amplifier 54 and the first gate electrode $G_1$, and the second Miller capacitor $C_{Miller2}$ is coupled between the output 58 of the voltage amplifier 54 and the second gate electrode $G_2$. In this regard, the output stage 74 can be regarded as a typical class AB rail-rail OpAmp output stage. The first Miller capacitor $C_{Miller1}$ and the second Miller capacitor $C_{Miller2}$ not only can stabilize controls of the first transistor 78P and the second transistor 78N (e.g., mitigating so-called Miller effect), but may also reduce the closed-loop output impedance of the voltage amplifier 54.

Notably, since the first Miller capacitor $C_{Miller1}$ and the second Miller capacitor $C_{Miller2}$ are each coupled to the output 58 of the voltage amplifier 54, the first Miller capacitor $C_{Miller1}$ and the second Miller capacitor $C_{Miller2}$ can reduce the inherent impedance $Z_{DPMIC}$, which is part of the output impedance $Z_{OUT}$.

In an embodiment, it is possible to configure the distributed power management circuit 38 to support the embodiments described above based on a process. In this regard, FIG. 5 is a flowchart of an exemplary process 200 for supporting distributed power management in the distributed power management circuit 38 of FIG. 2.

Herein, the distributed voltage modulation circuit 42 is coupled to the PMIC 40 via the first conductive trace 68 having the first inductive trace impedance $Z_{TRACE1}$ (step 202). Next, the distributed voltage modulation circuit 42 is coupled to the respective voltage input 48 in each of the power amplifier circuits 44(1)-44(N) via the second conductive trace 70 having the second inductive trace impedance $Z_{TRACE2}$ that is substantially smaller than the first inductive trace impedance $Z_{TRACE1}$ (e.g., 50 times smaller) (step 204). The distributed voltage modulation circuit 42 receives the modulated target voltage $V_{TGT}$ indicating that the modulated voltage $V_{CC}$ will change from the present voltage level $VL_P$ in the present time interval $S_{N-1}$ to the future voltage level $VL_F$ in the upcoming time interval $S_N$ (step 206). Accordingly, the voltage amplifier 54 in the distributed voltage modulation circuit 42 will be activated to change the modulated initial voltage $V_{AMP}$ prior to the start of the upcoming time interval $S_N$ such that the modulated initial voltage $V_{AMP}$ can be changed to the future voltage level $VL_F$ withing the defined temporal limit from the start of the upcoming time interval $S_N$ (step 208).

Those skilled in the art will recognize improvements and modifications to the preferred embodiments of the present disclosure. All such improvements and modifications are considered within the scope of the concepts disclosed herein and the claims that follow.

What is claimed is:

1. A distributed power management circuit comprising:
   a distributed voltage modulation circuit comprising:
      a voltage output that outputs a modulated voltage comprising a modulated initial voltage and a modulated offset voltage;
      a voltage amplifier configured to generate the modulated initial voltage;
      a voltage offset circuit coupled between the voltage amplifier and the voltage output and configured to generate the modulated offset voltage based at least on a low-frequency current generated outside the distributed voltage modulation circuit; and
      a control circuit configured to:
         receive a modulated target voltage indicating that the modulated voltage will change from a present voltage level in a present time interval to a future voltage level in an upcoming time interval;
         activate the voltage amplifier prior to a start of the upcoming time interval to increase the modulated voltage from the present voltage level toward the future voltage level when the future voltage level is higher than the present voltage level;
         activate the voltage amplifier prior to the start of the upcoming time interval to maintain the modulated voltage at the present voltage level when the future voltage level is lower than the present voltage level; and
         cause the voltage offset circuit to change the modulated offset voltage from the present voltage level to the future voltage level within a defined temporal limit from the start of the upcoming time interval and maintain the modulated offset voltage at the future voltage level in the upcoming time interval.

2. The distributed power management circuit of claim 1, wherein:
   the present time interval corresponds to a preceding one of a pair of consecutive orthogonal frequency division multiplexing (OFDM) symbols;
   the upcoming time interval corresponds to a succeeding one of the pair of consecutive OFDM symbols; and
   the defined temporal limit corresponds to a cyclic prefix (CP) in each of the pair of consecutive OFDM symbols.

3. The distributed power management circuit of claim 1, further comprising:
   a power management integrated circuit (PMIC) coupled to the voltage output via a first conductive trace having a first inductive trace impedance; and
   one or more power amplifier circuits each comprising a respective voltage input coupled to the voltage output via a second conductive trace having a second inductive trace impedance substantially smaller than the first inductive trace impedance.

4. The distributed power management circuit of claim 3, wherein the PMIC and the distributed voltage modulation circuits are provided in different dies.

5. The distributed power management circuit of claim 3, wherein the PMIC comprises:
   a multi-level charge pump (MCP) configured to generate a low-frequency voltage as a function of a battery voltage and based on a duty cycle determined according to the modulated target voltage; and
   a power inductor coupled to the voltage output via the first conductive trace and configured to induce the low-frequency current based on the low-frequency voltage.

6. The distributed power management circuit of claim 5, wherein the voltage offset circuit comprises:
   an offset capacitor coupled between an output of the voltage amplifier and the voltage output; and
   a bypass switch coupled between the output of the voltage amplifier and a ground.

7. The distributed power management circuit of claim 6, wherein the control circuit is further configured to:
  receive the modulated target voltage indicating that the modulated voltage will increase from the present voltage level to the future voltage level;
  activate the voltage amplifier prior to the start of the upcoming time interval to generate the modulated voltage at the future voltage level subtracted by the modulated offset voltage within the defined temporal limit;
  open the bypass switch after activating the voltage amplifier to thereby charge the offset capacitor to increase the modulated offset voltage from the present voltage level to the future voltage level based on the low-frequency current;
  close the bypass switch in response to the offset capacitor being charged up to the future voltage level; and
  deactivate the voltage amplifier after closing the bypass switch.

8. The distributed power management circuit of claim 6, wherein the control circuit is further configured to:
  receive the modulated target voltage indicating that the modulated voltage will decrease from the present voltage level to the future voltage level;
  activate the voltage amplifier prior to the start of the upcoming time interval to generate the modulated voltage at the present voltage level;
  open the bypass switch to discharge the offset capacitor to reduce the modulated offset voltage from the present voltage level to the future voltage level;
  close the bypass switch in response to the offset capacitor being discharged to the future voltage level; and
  deactivate the voltage amplifier after closing the bypass switch.

9. The distributed power management circuit of claim 3, wherein the voltage amplifier comprises:
  an input/bias stage configured to:
    receive the modulated target voltage and a feedback signal indicating the modulated voltage at the voltage output; and
    generate a pair of bias signals based on the modulated target voltage and the modulated voltage indicated in the feedback signal; and
  an output stage coupled to the input/bias stage and configured to generate the modulated initial voltage based on the pair of bias signals.

10. The distributed power management circuit of claim 9, wherein the output stage comprises:
  a first transistor comprising:
    a first drain electrode configured to receive a supply voltage;
    a first gate electrode configured to receive a first bias signal among the pair of bias signals; and
    a first source electrode coupled to an output of the voltage amplifier; and
  a second transistor comprising:
    a second source electrode coupled to the output of the voltage amplifier;
    a second gate electrode configured to receive a second bias signal among the pair of bias signals; and
    a second drain electrode coupled to a ground;
  wherein a selected one of the first transistor and the second transistor is biased by a selected one of the first bias signal and the second bias signal to output the modulated initial voltage at the output of the voltage amplifier.

11. The distributed power management circuit of claim 10, wherein the output stage further comprises:
  a first Miller capacitor coupled between the first gate electrode and the first source electrode and configured to reduce an impedance at the voltage output to thereby reduce an inductive impedance of the distributed voltage modulation circuit when the first transistor is biased by the first bias signal; and
  a second Miller capacitor coupled between the second gate electrode and the second source electrode and configured to reduce the impedance at the voltage output to thereby reduce the inductive impedance of the distributed voltage modulation circuit when the second transistor is biased by the second bias signal.

12. A distributed voltage modulation circuit comprising:
  a voltage output that outputs a modulated voltage comprising a modulated initial voltage and a modulated offset voltage;
  a voltage amplifier configured to generate the modulated initial voltage;
  a voltage offset circuit coupled between the voltage amplifier and the voltage output and configured to generate the modulated offset voltage based at least on a low-frequency current generated outside the distributed voltage modulation circuit; and
  a control circuit configured to:
    receive a modulated target voltage indicating that the modulated voltage will change from a present voltage level in a present time interval to a future voltage level in an upcoming time interval;
    activate the voltage amplifier prior to a start of the upcoming time interval to increase the modulated voltage from the present voltage level toward the future voltage level when the future voltage level is higher than the present voltage level;
    activate the voltage amplifier prior to the start of the upcoming time interval to maintain the modulated voltage at the present voltage level when the future voltage level is lower than the present voltage level; and
    cause the voltage offset circuit to change the modulated offset voltage from the present voltage level to the future voltage level within a defined temporal limit from the start of the upcoming time interval and maintain the modulated offset voltage at the future voltage level in the upcoming time interval.

13. The distributed voltage modulation circuit of claim 12, wherein the voltage offset circuit comprises:
  an offset capacitor coupled between an output of the voltage amplifier and the voltage output; and
  a bypass switch coupled between the output of the voltage amplifier and a ground.

14. The distributed voltage modulation circuit of claim 12, wherein the voltage amplifier comprises:
  an input/bias stage configured to:
    receive the modulated target voltage and a feedback signal indicating the modulated voltage at the voltage output; and
    generate a pair of bias signals based on the modulated target voltage and the modulated voltage indicated in the feedback signal; and
  an output stage coupled to the input/bias stage and configured to generate the modulated initial voltage based on the pair of bias signals.

15. The distributed voltage modulation circuit of claim 14, wherein the output stage comprises:
- a first transistor comprising:
  - a first drain electrode configured to receive a supply voltage;
  - a first gate electrode configured to receive a first bias signal among the pair of bias signals; and
  - a first source electrode coupled to an output of the voltage amplifier; and
- a second transistor comprising:
  - a second source electrode coupled to the output of the voltage amplifier;
  - a second gate electrode configured to receive a second bias signal among the pair of bias signals; and
  - a second drain electrode coupled to a ground;
- wherein a selected one of the first transistor and the second transistor is biased by a selected one of the first bias signal and the second bias signal to output the modulated initial voltage at the output of the voltage amplifier.

16. The distributed voltage modulation circuit of claim 15, wherein the output stage further comprises:
- a first Miller capacitor coupled between the first gate electrode and the first source electrode and configured to reduce an impedance at the voltage output to thereby reduce an inductive impedance of the distributed voltage modulation circuit when the first transistor is biased by the first bias signal; and
- a second Miller capacitor coupled between the second gate electrode and the second source electrode and configured to reduce the impedance at the voltage output to thereby reduce the inductive impedance of the distributed voltage modulation circuit when the second transistor is biased by the second bias signal.

17. A method of supporting distributed power management comprising:
- configuring a distributed voltage modulation to include a voltage output that outputs the modulated voltage, a voltage amplifier configured to generate the modulated initial voltage, and a voltage offset circuit comprising an offset capacitor coupled between an output of the voltage amplifier and the voltage output and configured to raise the modulated initial voltage by the modulated offset voltage to thereby generate the modulated voltage and a bypass switch coupled between the output of the voltage amplifier and a ground;
- receiving the modulated target voltage indicating that the modulated voltage will increase from the present voltage level to the future voltage level, activating the voltage amplifier prior to the start of the upcoming time interval to generate the modulated voltage at the future voltage level subtracted by the modulated offset voltage within the defined temporal limit, opening the bypass switch after activating the voltage amplifier to thereby charge the offset capacitor to increase the modulated offset voltage from the present voltage level to the future voltage level, closing the bypass switch in response to the offset capacitor being charged up to the future voltage level, and deactivating the voltage amplifier after closing the bypass switch; and
- receiving the modulated target voltage indicating that the modulated voltage will decrease from the present voltage level to the future voltage level, activating the voltage amplifier prior to the start of the upcoming time interval to generate the modulated voltage at the present voltage level, opening the bypass switch to discharge the offset capacitor to reduce the modulated offset voltage from the present voltage level to the future voltage level, closing the bypass switch in response to the offset capacitor being discharged to the future voltage level, and deactivating the voltage amplifier after closing the bypass switch.

18. A wireless device comprising:
- a distributed voltage modulation circuit comprising:
  - a voltage output that outputs a modulated voltage comprising a modulated initial voltage and a modulated offset voltage;
  - a voltage amplifier configured to generate the modulated initial voltage;
  - a voltage offset circuit coupled between the voltage amplifier and the voltage output and configured to generate the modulated offset voltage based at least on a low-frequency current generated outside the distributed voltage modulation circuit; and
  - a control circuit configured to:
    - receive a modulated target voltage indicating that the modulated voltage will change from a present voltage level in a present time interval to a future voltage level in an upcoming time interval;
    - activate the voltage amplifier prior to a start of the upcoming time interval to increase the modulated voltage from the present voltage level toward the future voltage level when the future voltage level is higher than the present voltage level;
    - activate the voltage amplifier prior to the start of the upcoming time interval to maintain the modulated voltage at the present voltage level when the future voltage level is lower than the present voltage level; and
    - cause the voltage offset circuit to change the modulated offset voltage from the present voltage level to the future voltage level within a defined temporal limit from the start of the upcoming time interval and maintain the modulated offset voltage at the future voltage level in the upcoming time interval; and
- a transceiver circuit configured to generate the modulated target voltage.

19. The wireless device of claim 18, wherein the transceiver circuit is further configured to provide the modulated target voltage to the control circuit via a radio frequency frontend (RFFE) interface.

20. The wireless device of claim 18, further comprising one or more power amplifier circuits each configured to amplify a respective radio frequency (RF) signal based on the modulated voltage.

* * * * *